United States Patent
Chou et al.

(10) Patent No.: US 8,384,400 B2
(45) Date of Patent: Feb. 26, 2013

(54) CAPACITANCE MEASUREMENT CIRCUIT AND METHOD THEREFOR

(75) Inventors: Shih-Tzung Chou, Zhudong Township, Hsinchu County (TW); Yong-Nien Rao, Hsinchu (TW); Yu Kuang, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 309 days.

(21) Appl. No.: 12/884,886

(22) Filed: Sep. 17, 2010

(65) Prior Publication Data

US 2011/0074446 A1 Mar. 31, 2011

(30) Foreign Application Priority Data

Sep. 30, 2009 (TW) .............................. 98133153 A

(51) Int. Cl.
*G01R 27/26* (2006.01)
(52) U.S. Cl. ........................................ 324/679; 324/658
(58) Field of Classification Search .................. 324/658, 324/679
See application file for complete search history.

(56) References Cited

U.S. PATENT DOCUMENTS 4,860,232 A * 8/1989 Lee et al. ...................... 702/104

* cited by examiner

*Primary Examiner* — Vincent Q Nguyen

(57) ABSTRACT

A capacitance measurement circuit includes an operation amplifier; a reference capacitor having a first terminal coupled to a first input terminal of the operation amplifier and a second terminal selectively coupled to a first or second reference voltage; a sensor capacitor having a first terminal coupled to a second input terminal of the operation amplifier and a second terminal selectively coupled to the first or second reference voltage; an approximation unit having an output terminal and an input terminal coupled to an output terminal of the operation amplifier; a conversion unit having an output terminal and an input terminal coupled to the output terminal of the approximation unit; and a coupling capacitor having a first terminal coupled to the first or second input terminal of the operation amplifier and a second terminal coupled to the output terminal of the conversion unit.

4 Claims, 2 Drawing Sheets

CAPACITANCE MEASUREMENT CIRCUIT AND METHOD THEREFOR

This application claims the benefit of Taiwan application Serial No. 98133153, filed Sep. 30, 2009, the subject matter of which is incorporated herein by reference.

BACKGROUND OF THE INVENTION

1. Field of the Invention

The invention relates in general to a capacitance measurement circuit and a method therefor, and more particularly to a capacitance measurement circuit for performing measurement in a differential manner, and a method therefor.

2. Description of the Related Art

Conventionally, a mechanical switch is usually adopted to implement a user control interface. A user needs to directly touch the conventional mechanical switch so that the conventional mechanical switch can perform an operation in response to a control instruction of the user. So, the conventional mechanical switch tends to be damaged in operation At present, a touch switch, such as a capacitive switch or the like, has been developed.

In order to enhance the convenience in use, a touch panel or a display touch panel with the display and touch functions, which have been developed, can accept the user's input or click. The touch panel or the display touch panel may be applied to various electronic devices, such as mobile telephones. Thus, the user can directly click frames on the touch panel or the display touch panel to perform operation, so that the more convenient and human-oriented operation mode may be provided. There are many kinds of touch panels or display touch panels, and a capacitive touch panel or a capacitive display touch panel is one of them.

When the user operates the capacitive touch panel, the capacitive display touch panel or the capacitive switch, the capacitance of the sensor capacitor therein is changed with the operation of the user. Thus, the operation of the user may be detected or sensed if the capacitance of the sensor capacitor and the variation thereof can be detected. However, it is a direction for the manufacturer to design a capacitance measurement circuit capable of effectively detecting the capacitance of the sensor capacitor and the variation thereof in order to enhance the performance of the capacitive touch panel, the capacitive display touch panel or the capacitive switch.

With regard to the current capacitance measurement circuit, however, the noise appearing in the input voltage source may be coupled into the capacitance measurement circuit so that the measurement result of the capacitance is affected.

SUMMARY OF THE INVENTION

Examples of the invention are directed to a capacitance measurement circuit and a method therefor, wherein the capacitance measurement is performed in a differential manner so that the noise resistiveness can be enhanced.

According to a first example of the present invention, a capacitance measurement circuit including an operation amplifier, a reference capacitor, a sensor capacitor, an approximation unit, a conversion unit and a coupling capacitor is provided. The operation amplifier has a first input terminal, a second input terminal and an output terminal. The reference capacitor has a first terminal coupled to the first input terminal of the operation amplifier and a second terminal selectively coupled to a first reference voltage or a second reference voltage. The sensor capacitor having a first terminal coupled to the second input terminal of the operation amplifier and a second terminal selectively coupled to the first reference voltage or the second reference voltage. The approximation unit has an output terminal and an input terminal coupled to the output terminal of the operation amplifier. The conversion unit has an output terminal and an input terminal coupled to the output terminal of the approximation unit. The coupling capacitor has a first terminal coupled to the first input terminal or the second input terminal of the operation amplifier and a second terminal coupled to the output terminal of the conversion unit.

According to a second example of the present invention, a capacitance measurement method for measuring a capacitance of a sensor capacitor is provided. The method includes the steps of: coupling a first charge quantity to a first input terminal of a comparator through a reference capacitor to form a first input voltage at the first input terminal of the comparator; coupling a second charge quantity to a second input terminal of the comparator through the sensor capacitor to form a second input voltage at the second input terminal of the comparator; differentially comparing the first input voltage with the second input voltage to generate a comparison result; and successively approximating an analog voltage according to the comparison result, wherein the analog voltage couples a third charge quantity to the first input terminal or the second input terminal of the comparator through a coupling capacitor, such that the first input voltage approximates the second input voltage, wherein a successive approximation result reflects the capacitance of the sensor capacitor.

According to a third example of the present invention, a capacitance measurement method for measuring a capacitance of a sensor capacitor is provided. The method includes: discharging a first input terminal and a second input terminal of a comparator; coupling a second terminal of a reference capacitor to a first reference voltage, wherein a first terminal of the reference capacitor is coupled to the first input terminal of the comparator; coupling a second terminal of the sensor capacitor to the first reference voltage, wherein a first terminal of the sensor capacitor is coupled to the second input terminal of the comparator; stopping discharging the first input terminal and the second input terminal of the comparator; switching the second terminal of the reference capacitor to a second reference voltage; switching the second terminal of the sensor capacitor to the second reference voltage; and successively approximating an analog voltage according to a comparison result of the comparator, wherein the analog voltage is coupled to the first input terminal or the second input terminal of the comparator through a coupling capacitor, such that a first input voltage of the first input terminal of the comparator approximates a second input voltage of the second input terminal, wherein a successive approximation result reflects the capacitance of the sensor capacitor.

The invention will become apparent from the following detailed description of the preferred but non-limiting embodiments. The following description is made with reference to the accompanying drawings.

DETAILED DESCRIPTION OF EMBODIMENTS OF THE INVENTION

In a capacitance measurement circuit and a method therefor according to embodiments of the invention, the capacitance measurement is performed in a differential manner so that the noise resistiveness can be enhanced.

Figure 1:
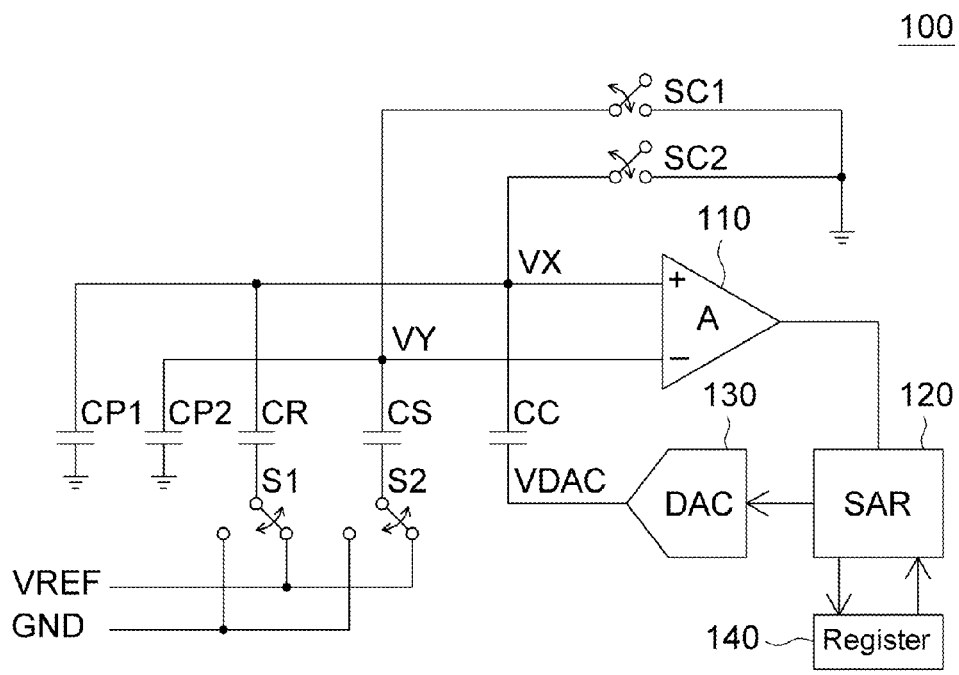
FIG. 1 is a schematic illustration showing a capacitance measurement circuit according to a first embodiment of the invention.

FIG. 1 is a schematic illustration showing a capacitance measurement circuit 100 according to a first embodiment of the invention. As shown in FIG. 1, the capacitance measurement circuit 100 includes a reference capacitor CR, a sensor capacitor CS, a coupling capacitor CC, an operation amplifier 110, a successive approximation register (SAR) 120, a digital-to-analog converter (DAC) 130 and switches S1, S2, SC1 and SC2. In addition, CP1 and CP2 represent parasitic capacitors of the capacitance measurement circuit 100. A register 140 is an optional element, which can temporarily store a digital signal outputted from the SAR 120 and also input parameters to the SAR 120.

The reference capacitor CR is coupled between the switch S1 and one input terminal (e.g., a noninverting input terminal) of the operation amplifier 110. The capacitance of the reference capacitor CR is known. The sensor capacitor CS is coupled to the switch S2 and the other input terminal (e.g., an inverting input terminal) of the operation amplifier 110. The capacitance of the sensor capacitor CS is unknown, and may be changed due to operations (e.g., press) of the user. In another embodiment of the invention, the reference capacitor CR may be coupled to the inverting input terminal of the operation amplifier 110, while the sensor capacitor CS is coupled to the noninverting input terminal of the operation amplifier 110.

The coupling capacitor CC is coupled to the operation amplifier 110 and the DAC 130. In FIG. 1, the coupling capacitor CC is coupled to the noninverting input terminal of the operation amplifier 110. However, in another embodiment of the invention, the coupling capacitor CC may be coupled to the inverting input terminal of the operation amplifier 110.

The noninverting input terminal of the operation amplifier 110 is coupled to the reference capacitor CR and the coupling capacitor CC. The inverting input terminal of the operation amplifier 110 is coupled to the sensor capacitor CS. The output terminal of the operation amplifier 110 is coupled to the SAR 120. The SAR 120 receives an analog output voltage of the operation amplifier 110, and thus outputs a digital signal to the DAC 130. The DAC 130 receives the digital signal outputted from the SAR 120, and converts the digital signal into an analog voltage VDAC outputted to the coupling capacitor CC.

The switch S1 has: one terminal coupled to the reference capacitor CR; and the other terminal selectively coupled to a reference voltage VREF and a ground GND. The switch S2 has: one terminal coupled to the sensor capacitor CS; and the other terminal selectively coupled to one of the reference voltage VREF and the ground GND.

The switch SC1 has: one terminal coupled to the inverting input terminal of the operation amplifier 110; and the other terminal coupled to the ground. Similarly, the switch SC2 has: one terminal coupled to the noninverting input terminal of the operation amplifier 110; and the other terminal coupled to the ground.

The operation of the capacitance measurement circuit 100 according to the first embodiment of the invention will be described in the following. First, in an initial state, the switches S1 and S2 are coupled to the ground GND. The switches SC1 and SC2 are also coupled to the ground GND such that the node voltages VX and VY are equal to 0 (i.e., the two input terminals of the operation amplifier 110 are discharged to the ground GND). In the following, the voltages VX and VY may represent both nodes and node voltages. That is, in the initial state, all the reference capacitor CR, the sensor capacitor CS and the coupling capacitor CC are discharged.

Next, when the measurement begins, the switches S1 and S2 have to be switched to the reference voltage VREF; and the switches SC1 and SC2 are turned off to stop discharging the two input terminals of the operation amplifier. Because the switch S1 is switched to the reference voltage VREF, the reference capacitor CR couples the charge quantity QR to the node VX through the coupling effect of the reference capacitor CR, wherein the charge quantity QR is expressed by the following Equation (1):

$$QR = VREF * CR \quad (1).$$

Similarly, the switch S2 is switched to the reference voltage VREF; and the sensor capacitor CS couples the charge quantity QS to the node VY through the coupling effect of the sensor capacitor CS, wherein the charge quantity QS is expressed by the following Equation (2):

$$QS = VREF * CS \quad (2).$$

If the sensor capacitor CS and the reference capacitor CR have different capacitances, then VX is unequal to VY. The operation amplifier 110 serving as a voltage comparator compares the node voltage VX with the node voltage VY, and transmits the voltage difference between VX and VY to the SAR 120. According to the analog output voltage of the operation amplifier 110, the SAR 120 adjusts (approximates) its digital output signal, and transmits the adjusted digital output signal to the DAC 130. Thereafter, the DAC 130 converts the digital output signal of the SAR 120 into the analog voltage VDAC. More particularly, VX is greater than VY when the capacitance of the reference capacitor CR is greater than the sensor capacitor CS; and vice versa.

The coupling capacitor CC couples the charge quantity QC to the node VX through the coupling effect of the coupling capacitor CC, wherein the charge quantity QC is expressed by the following Equation (3):

$$QC = VDAC * CC \quad (3).$$

Finally, the node voltage VX approximates VY through the successive approximation of the SAR 120. That is, the sum of the charge quantities QR and QC is equal to QS. So, VDAC may be derived as follows:

$$QR + QC = QS$$

$$VREF * CR + VDAC * CC = VREF * CS$$

$$VDAC = VREF(CS - CR)/CC \quad (4).$$

According to Equation (4), it is obtained that VDAC may reflect the capacitance difference between the capacitor CS and the reference capacitor CR. That is, the capacitance of the sensor capacitor CS may be obtained through the output digital signal of the SAR 120.

More specifically, the operations of the switches S1 and S2 may be changed in another embodiment of the invention. That is, both the switch S1 and the switch S2 are coupled to the reference voltage VREF in the initial state, and the switch S1 and the switch S2 are switched to the ground GND when the measurement begins.

Figure 2:
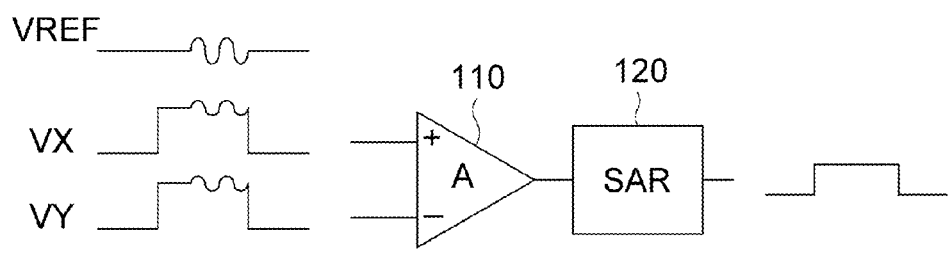
FIG. 2 is a schematic illustration showing a reference voltage VREF having noise.

Since the operation amplifier 110 compares the node voltages VX and VY in a differential manner, the noise resistiveness is better. FIG. 2 is a schematic illustration showing the reference voltage VREF having noise. As shown in FIG. 2, when the reference voltage VREF has noise, both the reference capacitor CR and the sensor capacitor CS couple the noise to the node voltages VX and VY so that the node voltages VX and VY fluctuate. However, because the operation amplifier 110 compares the node voltages VX and VY in the differential manner, the fluctuations of the node voltages VX and VY are cancelled by each other. Thus, the output signal of the SAR 120 will not be easily affected by the noise of the reference voltage VREF. Consequently, the capacitance measurement result will not be easily affected by the noise of the reference voltage VREF. As a result, it is obtained that the capacitance measurement circuit according to the first embodiment of the invention has high noise resistiveness.

Figure 3:
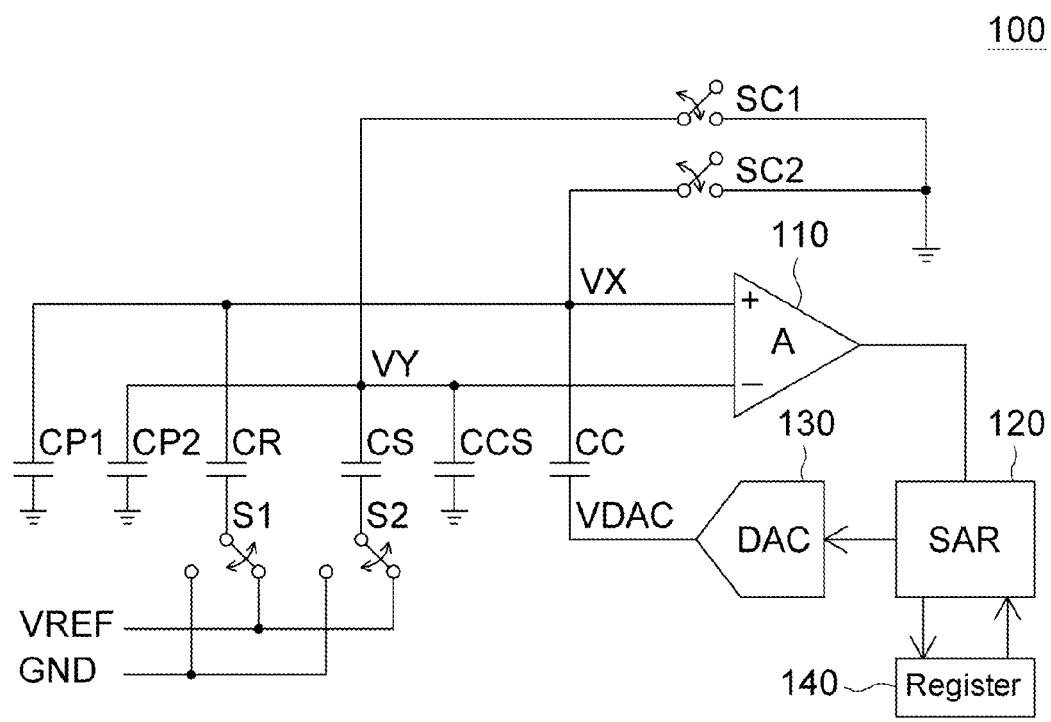
FIG. 3 is a schematic illustration showing a capacitance measurement circuit according to a second embodiment of the invention.

FIG. 3 is a schematic illustration showing a capacitance measurement circuit according to a second embodiment of the invention. Compared with the first embodiment of the invention, the capacitance measurement circuit according to the second embodiment of the invention further includes another coupling capacitor CCS for load matching. Because operations of the second embodiment of the invention are almost the same as or similar to that of the first embodiment, detailed descriptions thereof will be omitted. The coupling capacitor CCS is coupled between the inverting input terminal of the operation amplifier 110 and the ground. In another embodiment of the invention, however, the coupling capacitor CCS may be coupled between the inverting input terminal of the operation amplifier 110 and the ground. Basically, the coupling capacitor CC is not connected to the coupling capacitor CCS. Of course, the capacitance measurement circuit according to the second embodiment of the invention also has high noise resistiveness.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A capacitance measurement circuit, comprising:
   an operation amplifier having a first input terminal, a second input terminal and an output terminal;
   a reference capacitor having a first terminal coupled to the first input terminal of the operation amplifier and a second terminal selectively coupled to a first reference voltage or a second reference voltage;
   a sensor capacitor having a first terminal coupled to the second input terminal of the operation amplifier and a second terminal selectively coupled to the first reference voltage or the second reference voltage;
   an approximation unit having an output terminal and an input terminal coupled to the output terminal of the operation amplifier;
   a conversion unit having an output terminal and an input terminal coupled to the output terminal of the approximation unit;
   a coupling capacitor having a first terminal coupled to the first input terminal or the second input terminal of the operation amplifier and a second terminal coupled to the output terminal of the conversion unit;
   a first switch having a first terminal coupled to the second terminal of the reference capacitor and a second terminal coupled to the first reference voltage or the second reference voltage;
   a second switch having a first terminal coupled to the second terminal of the sensor capacitor and a second terminal coupled to the first reference voltage or the second reference voltage;
   a third switch having a first terminal coupled to the second input terminal of the operation amplifier and a second terminal selectively coupled to the second reference voltage;
   a fourth switch having a first terminal coupled to the first input terminal of the operation amplifier and a second terminal selectively coupled to the second reference voltage;
   a first parasitic capacitor having a first terminal coupled to the first input terminal of the operation amplifier and a second terminal coupled to the second reference voltage;
   a second parasitic capacitor having a first terminal coupled to the second input terminal of the operation amplifier and a second terminal coupled to the second reference voltage; and
   a match coupling capacitor having a first terminal coupled to the first input terminal or the second input terminal of the operation amplifier and a second terminal coupled to the second reference voltage.

2. The capacitance measurement circuit according to claim 1, wherein:
   all the first switch, the second switch, the third switch and the fourth switch are coupled to the second reference voltage in an initial state.

3. The capacitance measurement circuit according to claim 2, wherein when measurement begins,
   the first switch is switched to the first reference voltage; and the reference capacitor couples a first charge quantity to the first input terminal of the operation amplifier;
   the second switch is switched to the first reference voltage; and the sensor capacitor couples a second charge quantity to the second input terminal of the operation amplifier; and
   the third switch and the fourth switch are disconnected from the second reference voltage.

4. The capacitance measurement circuit according to claim 3, wherein:
   if a capacitance of the sensor capacitor is different from a capacitance of the reference capacitor, then a first input voltage of the first input terminal of the operation amplifier is different from a second input voltage of the second input terminal, and the operation amplifier compares the first input voltage with the second input voltage and outputs an output voltage to the approximation unit;
   the approximation unit outputs a digital output signal to the conversion unit according to the output voltage of the operation amplifier;
   the conversion unit converts the digital output signal of the approximation unit into an analog voltage; and
   the digital output signal of the approximation unit reflects a capacitance difference between the sensor capacitor and the reference capacitor through a successive approximation of the approximation unit to obtain a capacitance of the sensor capacitor.

* * * * *